(12) United States Patent
Utsunomiya

(10) Patent No.: US 8,877,540 B2
(45) Date of Patent: Nov. 4, 2014

(54) SOLAR CELL MODULE AND MANUFACTURING METHOD OF SOLAR CELL MODULE

(75) Inventor: Keiichiro Utsunomiya, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 13/808,319

(22) PCT Filed: Aug. 5, 2010

(86) PCT No.: PCT/JP2010/063285
§ 371 (c)(1),
(2), (4) Date: Jan. 4, 2013

(87) PCT Pub. No.: WO2012/017538
PCT Pub. Date: Feb. 9, 2012

(65) Prior Publication Data
US 2013/0102104 A1    Apr. 25, 2013

(51) Int. Cl.
*H01L 21/00* (2006.01)
*H01L 31/18* (2006.01)
*H01L 31/048* (2014.01)
*B32B 17/10* (2006.01)

(52) U.S. Cl.
CPC .............. *H01L 31/18* (2013.01); *B32B 2327/12* (2013.01); *H01L 31/0487* (2013.01); *B32B 2367/00* (2013.01); *B32B 17/10871* (2013.01); *B32B 17/10788* (2013.01); *B32B 17/10798* (2013.01); *B32B 17/10761* (2013.01); *Y02E 10/50* (2013.01); *H01L 31/048* (2013.01); *B32B 17/10018* (2013.01)
USPC ........................................................ 438/64

(58) Field of Classification Search
USPC ................... 438/64, 719, 753; 257/744, 749, 257/E21.077
See application file for complete search history.

(56) References Cited

U.S. PATENT DOCUMENTS

| 7,932,184 B2 * | 4/2011 | Ishii .............................. 438/753 |
| 2008/0230114 A1 | 9/2008 | Nakatani et al. |

FOREIGN PATENT DOCUMENTS

| JP | 2001-60706 A | 3/2001 |
| JP | 2005-101032 A | 4/2005 |
| JP | 2006-210405 A | 8/2006 |
| JP | 2007-281135 A | 10/2007 |
| JP | 2008-235603 A | 10/2008 |
| JP | 2009-081197 A | 4/2009 |

OTHER PUBLICATIONS

International Search Report (PCT/ISA/210) issued on Oct. 19, 2010, by the Japanese Patent Office as the International Searching Authority for International Application No. PCT/JP2010/063285.
Written Opinion (PCT/ISA/237) issued on Oct. 19, 2010, by the Japanese Patent Office as the International Searching Authority for International Application No. PCT/JP2010/063285.
Official Action issued by Japanese Patent Office on Jan. 28, 2014 in Japanese Application No. 2012-527508, and English language translation of Official Action (3 pgs).

* cited by examiner

*Primary Examiner* — Reema Patel
*Assistant Examiner* — Syed Gheyas
(74) *Attorney, Agent, or Firm* — Buchanan Ingersoll & Rooney PC

(57) ABSTRACT

A solar cell module includes a structure in which a back surface material, a back-surface-side sealing resin, a solar cell, a light-receiving-surface-side sealing resin, and a front surface material are laminated in sequential order, in which a melting point of a portion, which is in contact with the solar cell, of at least one of the light-receiving-surface-side sealing resin and the back-surface-side sealing resin is lower than a melting point of a portion, which is in contact with the back surface material, of the back-surface-side sealing resin.

2 Claims, 2 Drawing Sheets

SOLAR CELL MODULE AND MANUFACTURING METHOD OF SOLAR CELL MODULE

FIELD

The present invention relates to a solar cell module and a manufacturing method thereof and particularly to a sealing resin for protecting a solar cell against humidity and an external force.

BACKGROUND

The thickness of silicon substrates used in solar cell modules is gradually decreasing in order to reduce the manufacturing cost and the silicon substrates that are currently used have a thickness of equal to or less than 0.2 mm.

On the light receiving surface of a silicon substrate, a diffusion layer is formed, and an anti-reflective film and a silver electrode are formed sequentially thereon. On the non-light receiving surface, an aluminum electrode and a silver electrode are formed, thereby forming a solar cell having a power generation function. Solar cells are electrically connected in series with each other by solder-dipped flat rectangular copper wires, thereby forming a solar cell string or an array.

The light receiving surface side of the solar cell array is covered with a front surface material with a sealing resin therebetween and the non-light receiving surface side is covered with a back surface material with a sealing resin therebetween. The members are integrally molded by heat-sealing the sealing resins in a vacuum.

Typically, ethylene-vinyl acetate (EVA) is used for the sealing resin, glass is used for the front surface material, and a laminated sheet of a PET (polyethylene terephthalate) film or a fluorine film is used for the back surface material.

For a lamination process in which the above integral molding is performed, a laminating apparatus including a vacuum heating and pressurizing mechanism is used. The details of the lamination process will be explained next.

A laminate, in which a front surface material, a sealing resin, a solar cell array, a sealing resin, and a back surface material are superimposed in sequential order starting from the light receiving surface side, is set in the laminating apparatus. The laminate is heated by a heater in the laminating apparatus, in which air is evacuated. In a state where the sealing resins are heated to around their melting points, pressure is applied to the laminate. In this state, the sealing resins are further heated to around 150° C., which is maintained for a predetermined period of time, therefore, the sealing resins are cross-linked and the laminate is integrally molded.

For the above technology, the technology (for example, see Patent Literature 1) in which a sealing resin layer is used for each of the light receiving surface and the non-light receiving surface and the structure of a laminating apparatus (for example, see Patent Literature 2) are already disclosed.

CITATION LIST

Patent Literature

Patent Literature 1: Japanese Patent Application Laid-open No. 2007-281135
Patent Literature 2: Japanese Patent Application Laid-open No. 2001-60706

SUMMARY

Technical Problem

In the lamination process, which is one of the manufacturing processes of a solar cell module, a structure, in which a front surface material, a sealing resin, a solar cell, and a back surface material are laminated, is arranged in a vacuum heating chamber referred to as a laminator. Thereafter, the structure is heated to around the melting point of the sealing resin while evacuating air in the chamber together with the structure, a pressure is applied to the structure after softening the heated sealing resin, and the structure is further heated while maintaining this state, thereby forming a sealing structure in which the structure is integrally molded.

However, according to such a conventional technology, in the lamination process, if the structure is pressurized in a state where the sealing resin is not softened sufficiently, because the sealing resin is in a state of having a high elastic modulus, there is a problem that the pressing pressure is directly transmitted to the cell and the cell is damaged.

Conversely, if the sealing resin is heated excessively, thermal shrinkage of the sealing resin increases. At this point, because the sealing resin that is softened and has an adhesive force shrinks together with the cell and the back surface material, there is a problem that a degradation of the quality is caused due to a displacement of the cell and a deformation of the back surface material (back sheet).

Thus, the allowable temperature range of the temperature of the sealing resin when pressurization is started in the lamination process is limited and therefore it is required to control the temperature within the appropriate temperature range. Moreover, when the sealing resin is heated, temperature variations occur over the surface of the sealing resin, therefore, it is difficult to control the temperature of the sealing resin within the required temperature range.

In order to control the sealing resin within the above temperature range, there is a method of reducing the temperature variations over the surface of the sealing resin by heating the sealing resin over time at a gentle temperature gradient. However, in this case, a productivity is significantly reduced.

The present invention is achieved in view of the above and has an object to obtain a solar cell module capable of suppressing damage and displacement of a solar cell and deformation of a back surface material, and improving a productivity, and a manufacturing method thereof.

Solution to Problem

In order to solve above-mentioned problems and achieve the object, there is provided a manufacturing method of a solar cell module according to the present invention, wherein in lamination process, in which a structure in which a back surface material, a back-surface-side sealing resin, a solar cell, a light-receiving-surface-side sealing resin, and a front surface material are laminated in sequential order is integrated by applying pressure while heating the structure, temperature of the light-receiving-surface-side sealing resin and the back-surface-side sealing resin is controlled to be higher than a melting point of a portion, which is in contact with the solar cell, of at least one of the light-receiving-surface-side sealing resin and the back-surface-side sealing resin and lower than a melting point of a portion, which is in contact with the back surface material, of the back-surface-side sealing resin.

Advantageous Effects of Invention

According to this invention, an effect that damage and displacement of a solar cell and deformation of a back surface material can be suppressed is obtained.

DESCRIPTION OF EMBODIMENTS

Embodiments of a solar cell module and a manufacturing method thereof according to the present invention will be explained below in detail with reference to the drawings. This invention is not limited to the embodiments.

First Embodiment.

Figure 1:
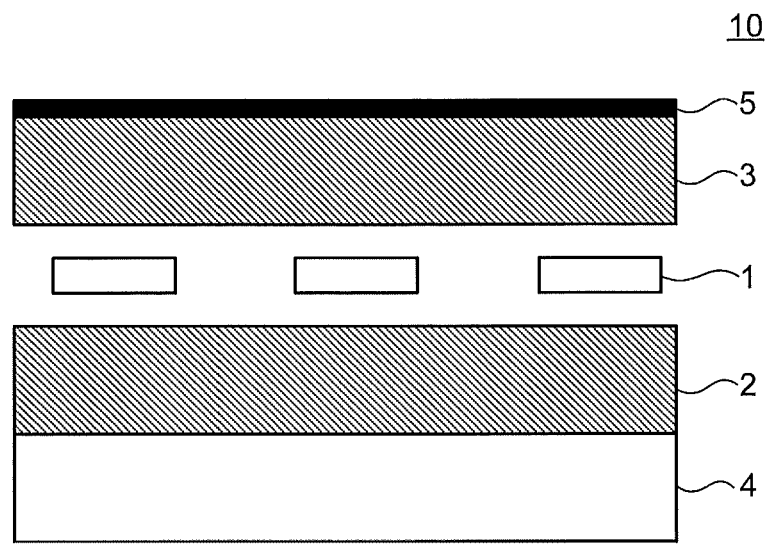
FIG. 1 is a schematic cross-sectional view illustrating a configuration of a solar cell module according to a first embodiment of the present invention.

FIG. 1 is a schematic cross-sectional view illustrating a configuration of a solar cell module 10 according to the first embodiment of the present invention. The solar cell module 10 includes a solar cell 1, a light-receiving-surface-side sealing resin 2 that seals the light receiving surface side of the solar cell 1, a front surface material 4 that covers the light receiving surface side of the light-receiving-surface-side sealing resin 2, a back-surface-side sealing resin 3 that seals the non-light receiving surface (back surface) side of the solar cell 1, and a back surface material 5 that covers the back surface side of the back-surface-side sealing resin 3.

For the light-receiving-surface-side sealing resin 2 and the back-surface-side sealing resin 3, for example, ethylene-vinyl acetate (EVA) is used. Moreover, for example, glass is used for the front surface material 4, and, for example, a laminated sheet of a PET (polyethylene terephthalate) film or a fluorine film is used for the back surface material 5. However, the materials thereof are not limited to these materials. For example, a material, such as polyvinyl butyral (PVB) and silicone resin, can be used for the light-receiving-surface-side sealing resin 2 and the back-surface-side sealing resin 3.

In the present embodiment, for the light-receiving-surface-side sealing resin 2 on the light receiving surface side and the back-surface-side sealing resin 3 on the non-light receiving surface side shown in FIG. 1, sealing resins having different melting points or different elastic moduli are used.

Specifically, a sealing resin having characteristics, i.e., a low melting point or a low elastic modulus, is used for the light-receiving-surface-side sealing resin 2. A sealing resin having characteristics, i.e., a high melting point or a high elastic modulus, is used for the back-surface-side sealing resin 3 on the non-light receiving surface side.

Moreover, the temperature is controlled such that the temperature of the sealing resins when pressurization is started in the lamination process is maintained between the melting points of the light-receiving-surface-side sealing resin 2 and the back-surface-side sealing resin 3 on the non-light receiving surface side. Consequently, the light-receiving-surface-side sealing resin 2 having a low melting point is definitely softened. Accordingly, when the solar cell 1 is pressed against the front surface material 4 by applying pressure, the light-receiving-surface-side sealing resin 2, which is present between the front surface material 4 and the solar cell 1, exhibits a cushioning effect, therefore, damage to the solar cell 1 due to the pressurization can be suppressed.

In contrast, because the back-surface-side sealing resin 3 having a high melting point does not reach the melting point, the back-surface-side sealing resin 3 is not softened sufficiently and does not exhibit a high adhesive force. Furthermore, because the amount of thermal shrinkage of the back-surface-side sealing resin 3 is small, the thermal shrinkage force due to softening of the light-receiving-surface-side sealing resin can be absorbed by a material, such as ethylene-vinyl acetate (EVA) having a high melting point, which is the material of the back-surface-side sealing resin 3 arranged on the side of the back surface material 5, therefore, transmission of the thermal shrinkage force to the back surface material 5 can be suppressed. As a result, the displacement and deformation of the solar cell 1 and the back surface material 5 can be suppressed.

In the present embodiment, it is sufficient to control the allowable temperature range when pressurization is started, between the melting points of the two sealing resins, i.e., the light-receiving-surface-side sealing resin 2 and the back-surface-side sealing resin 3, therefore, a temperature control becomes easy and a productivity can be improved.

Second Embodiment.

Figure 2:
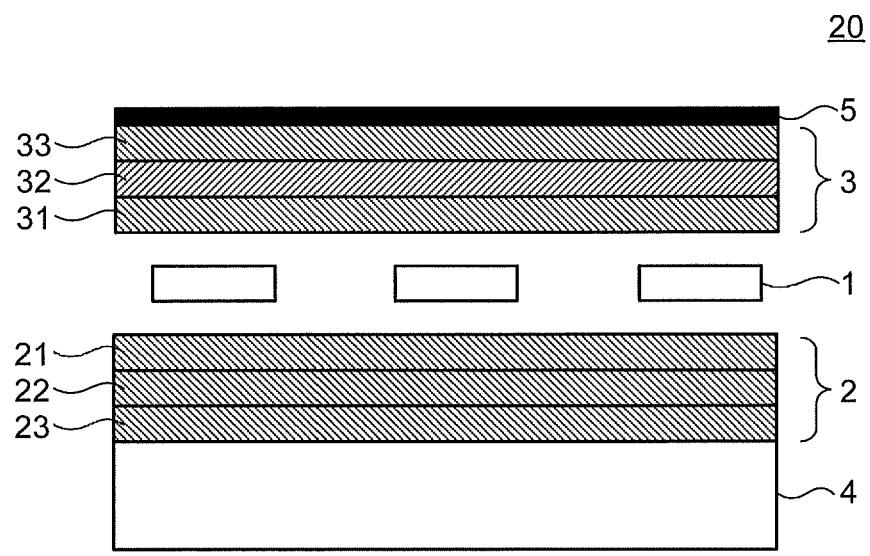
FIG. 2 is a schematic cross-sectional view illustrating a configuration of a solar cell module according to a second embodiment of the present invention.

FIG. 2 is a schematic cross-sectional view illustrating a configuration of a solar cell module 20 according to the second embodiment of the present invention. In a similar manner to FIG. 1 in the first embodiment, the configuration of the solar cell module 20 according to the present embodiment also includes the front surface material 4, the light-receiving-surface-side sealing resin 2, the solar cell 1, the back-surface-side sealing resin 3, and the back surface material 5, which are arranged in sequential order starting from the light receiving side. Moreover, for the material making up each layer, the materials exemplified in the first embodiment may be selected in a similar manner, however, the materials thereof are not limited to these materials.

In the second embodiment, as a method of further improving the manufacturing quality and the productivity, each of the light-receiving-surface-side sealing resin 2 and the back-surface-side sealing resin 3, which are sealing resins on the light receiving surface side and the non-light receiving surface side, respectively, is configured to be a multilayer sealing resin in which two or more layers of different types of sealing resins are laminated as shown in FIG. 2.

In the example in FIG. 2, the light-receiving-surface-side sealing resin 2 is composed of light-receiving-surface-side sealing resin layers 21, 22, and 23, which are arranged in sequential order starting from the side closest to the solar cell 1, and the back-surface-side sealing resin 3 is composed of back-surface-side sealing resin layers 31, 32, and 33, which are arranged in sequential order starting from the side closest to the solar cell 1. Specifically, for the light-receiving-surface-side sealing resin layers 21 to 23 and the back-surface-side sealing resin layers 31 to 33, which are sealing resins of the laminated layers, sealing resins having different melting points or different elastic moduli are used.

In the present embodiment, as the light-receiving-surface-side sealing resin layer 21 or the back-surface-side sealing resin layer 31 on the side closest to the solar cell 1, sealing resins having characteristics of a low melting point or a low elastic modulus, are arranged, and sealing resins having characteristics of a higher melting point or a higher elastic modulus, are arranged in sequential order as the distance from the solar cell 1 increases.

Accordingly, the light-receiving-surface-side sealing resin layer 23 has a higher melting point or a higher elastic modulus than the light-receiving-surface-side sealing resin layer 21 and the back-surface-side sealing resin layer 33 has a higher melting point or a higher elastic modulus than the back-surface-side sealing resin layer 31. It is more desirable that they are arranged such that the melting points of the light-receiving-surface-side sealing resin layer 23 and the back-surface-side sealing resin layer 33 are higher than the melting points of the light-receiving-surface-side sealing resin layer 21 and the back-surface-side sealing resin layer 31.

With respect to the structure of the sealing resins laminated as above, the temperature is controlled such that the temperature of the sealing resins when pressurization is started in the lamination process is between the lowest melting point and the highest melting point among the melting points of the sealing resins of the layers on the light receiving surface side and the non-light receiving surface side. In other words, the temperature is controlled such that the temperature of the sealing resins when pressurization is started is higher than the melting points of the light-receiving-surface-side sealing resin layer 21 and the back-surface-side sealing resin layer 31 on the side closest to the solar cell 1 and is lower than the melting points of the light-receiving-surface-side sealing resin layer 23 and the back-surface-side sealing resin layer 33 on the side farthest from the solar cell 1.

More specifically, the temperature is controlled such that the temperature of the sealing resins when pressurization is started is maintained between a higher melting point T1 in the case where there is a difference between melting points of the light-receiving-surface-side sealing resin layer 21 and the back-surface-side sealing resin layer 31 and a lower melting point T2 in the case where there is a difference between melting points of the light-receiving-surface-side sealing resin layer 23 and the back-surface-side sealing resin layer 33. The premise here is that the laminated structure is formed by selecting resins that satisfy T1<T2.

Consequently, when pressurization is started in the lamination process, the light-receiving-surface-side sealing resin layer 21 and the back-surface-side sealing resin layer 31 arranged on both sides, i.e., the light receiving surface side and the non-light receiving surface side, respectively, of the solar cell 1 are completely softened and exhibit a cushioning property, therefore, damage to the solar cell 1 due to the pressurization can be absorbed by both sides.

Furthermore, the thermal shrinkage force due to softening of the sealing resins (the light-receiving-surface-side sealing resin layer 21 and the back-surface-side sealing resin layer 31) can be absorbed by a material, such as ethylene-vinyl acetate (EVA) having a high melting point, which is the material of the back-surface-side sealing resin layer 33 arranged on the side of the back surface material 5, therefore, transmission of the thermal shrinkage force to the back surface material 5 can be suppressed. As a result, the displacement and deformation of the solar cell 1 and the back surface material 5 can be suppressed.

Moreover, according to the present embodiment, it is possible to increase the allowable temperature range of the sealing resins when pressurization is started in the lamination process compared with the conventional technology, therefore, a productivity can be further improved.

As explained above, the light-receiving-surface-side sealing resin layer 21 and the back-surface-side sealing resin layer 31, which are sealing resins arranged closest to both sides of the solar cell 1, can be completely softened, therefore, a cushioning property can be maintained even if the overall thickness of the layers on both sides of the solar cell 1 is reduced as compared with the conventional sealing resin.

In other words, the thickness of each of the sealing resin layers 21 to 23 and 31 to 33 shown in FIG. 2 can be arbitrarily selected while maintaining the above cushioning property. Accordingly, the overall cost can be reduced while maintaining the above effect by reducing the total thickness of the sealing resins of the layers in the present embodiment as compared with the total thickness of a conventional sealing resin.

Moreover, the light-receiving-surface-side sealing resin 2 and the back-surface-side sealing resin 3 in FIG. 2 in the present embodiment are each composed of three layers, however, the number of layers is not limited to this and it is sufficient that each of them has multiple layers of two or more layers so that the above effect can be obtained. Accordingly, the number of layers of the multilayer sealing resin does not need to be the same between the light receiving surface side and the back surface side as long as a similar effect can be obtained.

In this manner, the solar cell module in the present embodiment is such that the sealing resin used on the light receiving surface side and the non-light receiving surface side is composed of multiple layers of two or more layers, and sealing resins having characteristics of a low melting point or a low elastic modulus, are used on the sides closest to the solar cell and sealing resins having characteristics, i.e., a higher melting point or a higher elastic modulus, are used in sequential order as the distance from the solar cell increases.

Furthermore, in the manufacturing method of the solar cell module in the present embodiment, the temperature of the sealing resins when pressurization is started in the lamination process is controlled between the lowest melting point and the highest melting point. Therefore, cracking of the cell can be prevented by definitely softening the sealing resins having a low melting point on the solar cell side and transmission of the shrinkage force to the back surface material can be prevented by causing the thermal shrinkage force when the sealing resins are softened to be absorbed by the sealing resin having a high melting point on the back surface material side.

In other words, in the solar cell module and the manufacturing method thereof in the present embodiment, for example, the cost of ethylene-vinyl acetate (EVA) that is a sealing resin material can be reduced and the quality can be improved by optimizing the combination of the thickness and the melting point or the elastic modulus of each of the multi-laminated sealing resin layers. Furthermore, a temperature control in the lamination process becomes easy and a productivity can be improved.

Third Embodiment.

Figure 3:
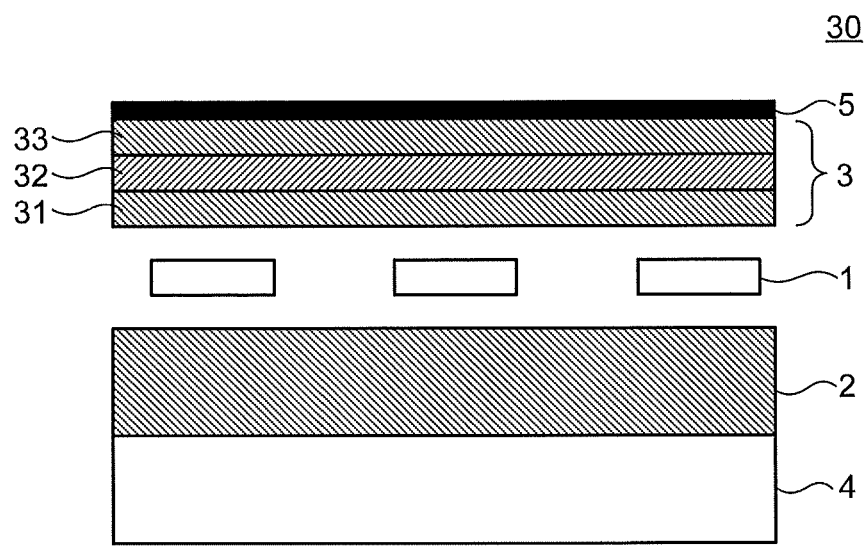
FIG. 3 is a schematic cross-sectional view illustrating a configuration of a solar cell module according to a third embodiment of the present invention.

FIG. 3 is a schematic cross-sectional view illustrating a configuration of a solar cell module 30 according to the third embodiment of the present invention. In the present embodiment, the structures shown in the first and second embodiments are combined. For example, as shown in FIG. 3, the sealing resin on the light receiving surface side is composed of a single layer of the light-receiving-surface-side sealing resin 2 having a low melting point in a similar manner to the first embodiment and the sealing resin on the back surface side is composed of multiple layers of the back-surface-side sealing resin layers 31 to 33 in a similar manner to the second embodiment. For other components, components having the same function as those in FIG. 1 and FIG. 2 are denoted by the same reference numerals.

In the present embodiment, a material having a low melting point similar to the light-receiving-surface-side sealing resin 2 is selected for the back-surface-side sealing resin layer 31 and a material having a melting point higher than that of the back-surface-side sealing resin layer 31 and the light-receiving-surface-side sealing resin 2 is selected for the back-surface-side sealing resin layer 33.

In the lamination process in which the solar cell module 30 having such a configuration is manufactured, the temperature of the sealing resins when pressurization is started is maintained to be higher than the melting points of the back-surface-side sealing resin layer 31 and the light-receiving-surface-side sealing resin 2 and lower than the melting point of the back-surface-side sealing resin layer 33. Consequently, in a similar manner to the first embodiment, because the back-surface-side sealing resin layer 33 having a high melting point does not reach the melting point, the back-surface-side sealing resin layer 33 is not softened sufficiently, therefore, the displacement and deformation of the back surface material 5 can be suppressed. Moreover, in a similar manner to the second embodiment, the back-surface-side sealing resin layer 31 and the light-receiving-surface-side sealing resin 2 are completely softened and exhibit a cushioning property, therefore, a damage to the solar cell 1 due to the pressurization can be absorbed by the layers on both sides of the solar cell 1. Accordingly, the overall cost can be reduced while maintaining a cushioning effect by reducing the total thickness of the sealing resins while maintaining a cushioning property.

Moreover, if sealing resins having the same melting point are used as the back-surface-side sealing resin layer 31 and the light-receiving-surface-side sealing resin 2, it is sufficient to control the allowable temperature range when pressurization is started, between the melting point of the sealing resins and the melting point of the back-surface-side sealing resin layer 33, therefore, a temperature control becomes easy and a productivity can be improved.

Furthermore, the thermal shrinkage force due to softening of the sealing resins (the light-receiving-surface-side sealing resin 2 and the back-surface-side sealing resin layer 31) can be absorbed by a material, such as ethylene-vinyl acetate (EVA) having a high melting point, which is the back-surface-side sealing resin layer 33 arranged on the side of the back surface material 5, therefore, transmission of the thermal shrinkage force to the back surface material 5 can be suppressed. As a result, the displacement and deformation of the solar cell 1 and the back surface material 5 can be suppressed. In this manner, in the present embodiment, the effects of the first and second embodiments can be obtained.

Moreover, in the present embodiment, if the melting point of the back-surface-side sealing resin layer 31 is low, the above-described cushioning property can be exhibited in the lamination process, therefore, the melting point of the light-receiving-surface-side sealing resin 2 is not necessarily low. In other words, even if a material having a high melting point is selected for the light-receiving-surface-side sealing resin 2 in a similar manner to the back-surface-side sealing resin layer 33, an effect similar to the above can be obtained.

Fourth Embodiment.

Figure 4:
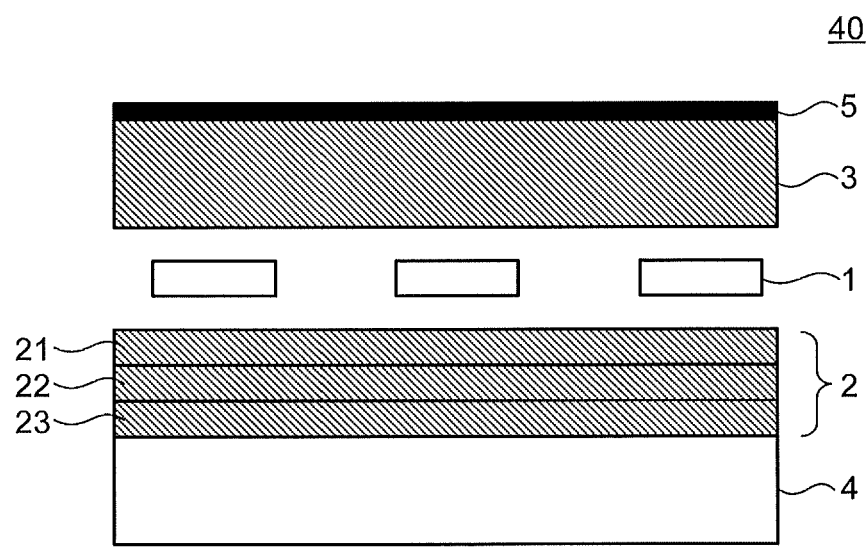
FIG. 4 is a schematic cross-sectional view illustrating a configuration of a solar cell module according to a fourth embodiment of the present invention.

FIG. 4 is a schematic cross-sectional view illustrating a configuration of a solar cell module 40 according to the fourth embodiment of the present invention. In the present embodiment also, the structures shown in the first and second embodiments are combined in a similar manner to the third embodiment. However, in contrast to the third embodiment, for example, as shown in FIG. 4, the sealing resin on the light receiving surface side is composed of multiple layers of the light-receiving-surface-side sealing resin layers 21 to 23 in a similar manner to the second embodiment and the sealing resin on the back surface side is composed of a single layer of the back-surface-side sealing resin 3 having a high melting point in a similar manner to the first embodiment. For other components, components having the same function as those in FIG. 1 and FIG. 2 are denoted by the same reference numerals.

In the present embodiment, a material having a high melting point similar to the back-surface-side sealing resin 3 is selected for the light-receiving-surface-side sealing resin layer 23 and a material having a melting point lower than the light-receiving-surface-side sealing resin layer 23 and the back-surface-side sealing resin 3 is selected for the light-receiving-surface-side sealing resin layer 21.

In the lamination process in which the solar cell module 40 having such a configuration is manufactured, the temperature of the sealing resins when pressurization is started is maintained to be higher than the melting point of the light-receiving-surface-side sealing resin layer 21 and lower than the melting points of the light-receiving-surface-side sealing resin layer 23 and the back-surface-side sealing resin 3. Consequently, in a similar manner to the first embodiment, because the back-surface-side sealing resin 3 having a high melting point does not reach the melting point, the back-surface-side sealing resin 3 is not softened sufficiently and does not exhibit a high adhesive force. Furthermore, because the amount of thermal shrinkage is small, an effect can be obtained where the displacement and deformation of the solar cell 1 and the back surface material 5 can be suppressed.

In contrast, the light-receiving-surface-side sealing resin layer 21 having a low melting point is definitely softened. Accordingly, when the solar cell 1 is pressed against the front surface material 4 by applying pressure, the light-receiving-surface-side sealing resin layer 21, which is present between the front surface material 4 and the solar cell 1, exhibits a cushioning effect, therefore, a damage to the solar cell 1 due to the pressurization can be suppressed.

Moreover, if sealing resins having the same melting point are used as the back-surface-side sealing resin 3 and the light-receiving-surface-side sealing resin layer 23, it is sufficient to control the allowable temperature range when pressurization is started, between the melting point of the sealing resins and the melting point of the light-receiving-surface-side sealing resin layer 21, therefore, temperature control becomes easy and productivity can be improved.

In this manner, in the present embodiment also, the overall thickness can be reduced compared with the total thickness of a conventional sealing resin by reducing the total thickness of the sealing resins of the layers while maintaining a cushioning property. Accordingly, the overall cost can be reduced while maintaining a cushioning property. In this manner, in the present embodiment also, the effects of the first and second embodiments can be obtained.

Furthermore, the present invention is not limited to the above embodiments and can be variously modified at the execution stage without departing from the gist thereof. Moreover, the above-described embodiments include inventions in various stages and various inventions can also be extracted by appropriately combining a plurality of disclosed components.

For example, even if several components are omitted from all the components shown in the above first to fourth embodiments, a configuration in which the several components are omitted can be extracted as an invention as long as the problem described in the column of Technical Problem can be solved and the effects described in the column of Advantageous Effects of Invention can be obtained. Furthermore, the components in the above-described first to fourth embodiments may be appropriately combined.

Industrial Applicability

As above-described, a solar cell module and a manufacturing method of the solar cell module according to the present invention are suitable for a solar cell module, which is formed by arranging sealing resins on both sides, i.e., a light receiving surface side and a non-light receiving surface side, of a solar cell and pressing and bonding the sealing resins in a lamination process, and a manufacturing method of the solar cell module.

REFERENCE SIGNS LIST 1 solar cell
2 light-receiving-surface-side sealing resin
21, 22, 23 light-receiving-surface-side sealing resin layer
3 back-surface-side sealing resin
31, 32, 33 back-surface-side sealing resin layer
4 front surface material
5 back surface material
10, 20, 30, 40 solar cell module

The invention claimed is:

1. A manufacturing method of a solar cell module, wherein in lamination process, in which a structure in which a back surface material, a back-surface-side sealing resin, a solar cell, a light-receiving-surface-side sealing resin, and a front surface material are laminated in sequential order is integrated by applying pressure while heating the structure, temperature of the light-receiving-surface-side sealing resin and the back-surface-side sealing resin is controlled to be higher than a melting point of a portion, which is in contact with the solar cell, of at least one of the light-receiving-surface-side sealing resin and the back-surface-side sealing resin and lower than a melting point of a portion, which is in contact with the back surface material, of the back-surface-side sealing resin, the temperature of the manufacturing method being controlled to not be equal to or higher than the melting point of the portion of the back-surface-side-sealing resin in contact with the back surface material so that deformation of the back surface material is suppressed.

2. The manufacturing method of a solar cell module according to claim 1, wherein
the light-receiving-surface-side sealing resin includes a plurality of light-receiving-surface-side sealing resin layers,
the back-surface-side sealing resin includes a plurality of back-surface-side sealing resin layers, and
a temperature of the light-receiving-surface-side sealing resin and the back-surface-side sealing resin before pressurization is started is controlled to be higher than a melting point of a sealing resin layer, which is in contact with the solar cell, of the light-receiving-surface-side sealing resin and a melting point of a sealing resin layer, which is in contact with the solar cell, of the back-surface-side sealing resin and lower than a melting point of a sealing resin layer, which is in contact with the front surface material, of the light-receiving-surface-side sealing resin and a melting point of a sealing resin layer, which is in contact with the back surface material, of the back-surface-side sealing resin.

* * * * *